United States Patent
Freundlich et al.

[11] Patent Number: 6,150,604
[45] Date of Patent: *Nov. 21, 2000

[54] QUANTUM WELL THERMOPHOTOVOLTAIC ENERGY CONVERTER

[75] Inventors: Alex Freundlich; Alex Ignatiev, both of Houston, Tex.

[73] Assignee: University of Houston, Houston, Tex.

[*] Notice: This patent issued on a continued prosecution application filed under 37 CFR 1.53(d), and is subject to the twenty year patent term provisions of 35 U.S.C. 154(a)(2).

[21] Appl. No.: 09/105,643

[22] Filed: Jun. 26, 1998

Related U.S. Application Data

[63] Continuation-in-part of application No. 08/568,129, Dec. 6, 1995, Pat. No. 5,851,310.

[51] Int. Cl.[7] ................................................. H01L 31/00
[52] U.S. Cl. .......................... 136/253; 136/255; 136/262; 257/21; 257/22
[58] Field of Search ..................... 136/253, 255, 136/262; 257/21, 22

[56] References Cited

U.S. PATENT DOCUMENTS

| | | | |
|---|---|---|---|
| 4,234,352 | 11/1980 | Swanson | 136/253 |
| 4,688,068 | 8/1987 | Chaffin et al. | 136/249 |
| 4,746,370 | 5/1988 | Woolf | 136/246 |
| 4,773,945 | 9/1988 | Woolf et al. | 136/256 |
| 5,019,177 | 5/1991 | Wanlass | 136/249 |
| 5,342,451 | 8/1994 | Virshup | 136/244 |
| 5,389,158 | 2/1995 | Fraas et al. | 136/244 |
| 5,407,491 | 4/1995 | Freundlich et al. | 136/249 |
| 5,496,415 | 3/1996 | Barnham | 136/255 |
| 5,626,687 | 5/1997 | Campbell | 136/259 |

*Primary Examiner*—Mark Chapman
*Attorney, Agent, or Firm*—Baker Botts L.L.P.

[57] ABSTRACT

A thermophotovoltaic cell is provided containing strained or lattice-matched quantum wells that have a bandgap smaller than the bandgap of the InGaAs alloy. The alloy is lattice-matched to the substrate. These narrow bandgap quantum wells provide more efficient conversion of IR emission from a black body or other emitter by converting energy from a wider range of wavelengths than a conventional single junction cell. The thickness of the quantum well region and the individual thickness of the individual quantum wells are chosen to avoid lattice mismatch defects which cause degradation of thick conventional lattice mismatched devices.

5 Claims, 4 Drawing Sheets

○——○ $In_x Ga_{1-x}As/In_{0.52}Ga_{0.48}As$ MQW CELL
20 PERIODS 90/190 ANGSTROM WELL/BARRIER
▽ $In_{0.52}Ga_{0.48}As$ p/n

—— $InGa_{1-x}As/In_{0.53}Ga_{0.47}As$ QW
○——○ $In_xGa_{1-x}As$ BULK

QUANTUM WELL THERMOPHOTOVOLTAIC ENERGY CONVERTER

This is a continuation-in-part of application Ser. No. 08/568,129, filed Dec. 6, 1995 now U.S. Pat. No. 5,851,310.

BACKGROUND OF THE INVENTION

1. Field of the Invention

This invention pertains to conversion of infrared radiation to electrical energy. More particularly, an indium-gallium-arsenide p-i-n photovoltaic cell is modified by insertion of strained quantum wells while avoiding lattice defects to increase conversion efficiency.

2. Description of Related Art

Thermophotovoltaic (TPV) energy conversion is a potentially environmentally friendly approach to achieve high efficiency, compact and reliable sources of electrical energy. In TPV conversion, a source of energy such as concentrated sunlight, nuclear power, fossil fuel, or a radioisotope heat source is used to heat an intermediate thermal emitter. The emitter then radiates photons which impinge on a photovoltaic cell.

There is now renewed interest in TPV energy conversion using nuclear energy sources or combustion driven systems operating at low temperatures (<1500K). Possible uses include power generation for deep space exploration, silent portable gas or natural gas operated generators, non-polluting and silent energy generation for natural gas operated vehicles, power cogeneration (using conversion of waste heat into electricity), and peak electricity for power utilities or household use.

Common to all TPV systems operating at moderate emitter temperatures is the desire for low-bandgap photovoltaic devices that can convert efficiently the infrared-rich spectrum emanating from the emitter. In conventional photovoltaic cells the electron and hole result from absorption of a photon with energy above the bandgap. These carriers rapidly thermalize to their respective band edges. The fundamental efficiency limitation in a conventional cell results from the trade-off between a low bandgap, which maximizes light absorption and hence the output current, and a high bandgap, which maximizes output voltage. The spectral energy peak of a 1200 C (1500K) black body falls at a wavelength of 2 microns. As a result, for silicon photovoltaic devices only a very small portion (<2%) of the emitted energy is above the bandgap and is available for PV conversion. Therefore the use of narrower bandgap semiconductors has been identified as a necessary condition to achieve higher efficiencies. Most of the existing development work is concentrated around two semiconductor systems: the ternary InGaAs cells fabricated on InP substrates and GaSb cells and the GaInAsSb quaternary alloys fabricated on GaSb substrates. However, currently, GaSb based technologies are only available in 2-inch diameter wafers, while the 3-inch diameter wafers used for InGaAs cells have twice the area, resulting in twice as many cells per processed wafer. High quality InP wafers are available from several competitive vendors due to the telecommunication industry's need for 1.5 microns detectors and lasers, while GaSb wafer production, limited to a much smaller TPV market, is still in a development stage. Consequently, U.S. companies and major government laboratories involved in TPV have mainly concentrated their research effort on the development of low-bandgap (0.55 to 75 eV) InGaAs devices fabricated on InP substrates. The initial effort was directed toward the fabrication of TPV cells using $Ga_{0.47}In_{0.52}As$ with an energy bandgap of 0.75 eV and a material lattice constant matched to InP. These cells exhibit excellent PV characteristics; however, their efficiency for a 1500K spectrum is limited by transparency losses. The most recent research approach has promoted the use of narrower bandgap InGaAs (0.6–0.55 eV). In fact, for a 0.55 eV cell 35% of the black body energy is from photons with energy above the bandgap instead 14% for the $Ga_{0.47}In_{0.52}As$ (0.75 eV) cell. However, these narrower bandgap cells are fabricated with materials presenting 1–2% lattice mismatch with respect to the InP substrates. The large lattice mismatch between the substrate and the device material leads to the generation of dislocations for thickness exceeding a few hundreds of Angstroms. A conventional P/N junction cell requires an active area thickness larger than 2 microns. The presence of dislocations results in a reduction of the minority carrier lifetime and hence leads to a poor performance. In order, to partially reduce the defect density in the device active region, 3–4 micrometer step-graded buffer layers or superlattices (U.S. Pat. No. 4,688,068) can be deposited prior to the active device growth. Incorporating these additional steps increases substantially the epitaxial process cost. Furthermore, the remaining dislocation density ($>10^8 cm^{-2}$) may still lead to the aging of the TPV cell.

Recently, in the context of solar cells, it has been proposed that the use of periodic layers (quantum wells) in the active region of the device can enhance conversion efficiency. (U.S. Pat. No. 5,496,415) What is needed is a process which both increases IR conversion efficiency of a conventional InGaAs-lattice-matched-to-InP thermophotovoltaic cell and prevents the generation of dislocations in the device.

SUMMARY OF THE INVENTION

A thermophotovoltaic (TPV) converter is provided where one or several thin (several nm) strained or lattice-matched quantum wells having a bandgap smaller than that of the $In_{0.52}Ga_{0.48}As$ alloy are introduced between the conventional p-conductivity and n-conductivity cell which is lattice matched to the substrate material. The presence of these narrow bandgap quantum wells allows for more efficient conversion of the IR emission emanating from a black body or a selective emitter over a wider range of wavelengths than a conventional single junction cell and decreases transparency losses of the conventional cell. The approach hence may be used to increase the cell current output and efficiency and make it comparable or better than that of a lattice mismatched bulk-like (0.55–0.65 eV) InGaAs cell. The total thickness of the quantum well region and the individual thickness of the individual quantum wells (few nm) can be chosen so that no lattice mismatch defects are generated. This approach circumvents the crystalline quality and electronic performance degradation associated with the fabrication of thick conventional lattice mismatched devices. Materials are selected based on physical properties determining energy bandgap and low-defect crystal growth.

A method of fabrication of photovoltaic devices is provided where ternary strained and lattice matched (In, Ga) As alloys are used as well material in the quantum well region of a conventional (In,Ga) As cell lattice-matched to an InP substrate. Strained narrow bandgap $In_xGa_{1-x}As/In_{0.47}Ga_{0.53}As$ (x>0.6) multiple quantum wells (MQW) are introduced within the intrinsic region of a conventional $In_{0.47}Ga_{0.53}As$ p-i-n cell lattice-matched to InP. An appropriate choice of well and barrier thickness and number of wells in the i-region maintains the pseudomorphism (i.e., lack of crystal defects) and lattice-matching to InP, while the presence of narrow bandgap wells extends photon absorption up to that of confined energy states in the wells. For low-temperature black body emitters (1000–1500K) this new device conversion efficiency will exceed twice that of its conventional counterpart. The method of this invention can be used to select other material systems for thermovoltaic converters.

DESCRIPTION OF THE PREFERRED EMBODIMENTS

Figure 1:
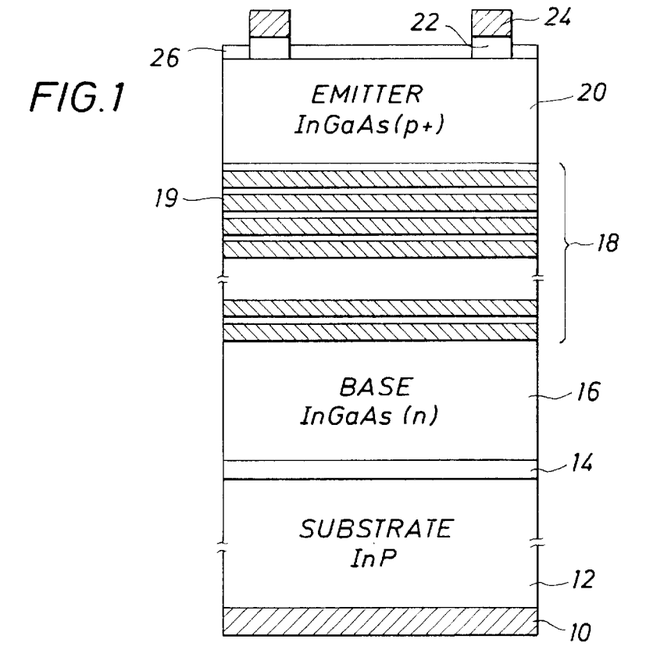
FIG. 1 is a sketch of the thermophotovoltaic cell of this invention.

Referring to FIG. 1, strained, thin $In_xGa_{1-x}As$ layers (quantum wells) are shown in the intrinsic region of a 0.75 eV InGaAs p-i-n cell. This materials system is shown as an example of the devices of this invention. The apparatus and method of this invention can be used with a wide variety of materials systems that have the required properties set out below. The cell is fabricated on substrate 12, the top layer of which may be lattice-matched to indium phosphide and the bottom layer of which is back contact 10 which is preferably a reflective or mirror surface. Alternatively, an in-situ mirror may be placed between the active layers and the cell substrate, as disclosed in U.S. Pat. No. 5,626,687 to Campbell. Back surface field 14, base 16, intrinsic region 18 and emitter 20 are shown. Other alloys may be used if lattice-matched to substrate 12. In the thermophotovoltaic cell (TPV) of this invention, intrinsic region 18 includes one or more quantum wells 19. Contact layer 22, front contact 24 and window or antireflective coating 26 complete the TPV.

A method for predicting the optical and electrical characteristics of such devices for low-temperature (for example, approximately 1000 to 2000° K) TPV applications is described below. The InGaAs material in the quantum wells (QWs) is undergoing compressive strain. Therefore, it is important to identify both the strain modifications to the band structure and the design parameters to avoid lattice relaxation. A method for assessment of possible QW thickness and number of QWs is provided. Results of the assessment can be checked experimentally using techniques such as X-ray diffraction or transmission electron microscopy to determine the absence of lattice relaxation using techniques described below. A description of the modeling of the optical properties and device characteristics of the MQW TPV cell follows.

Figure 2:
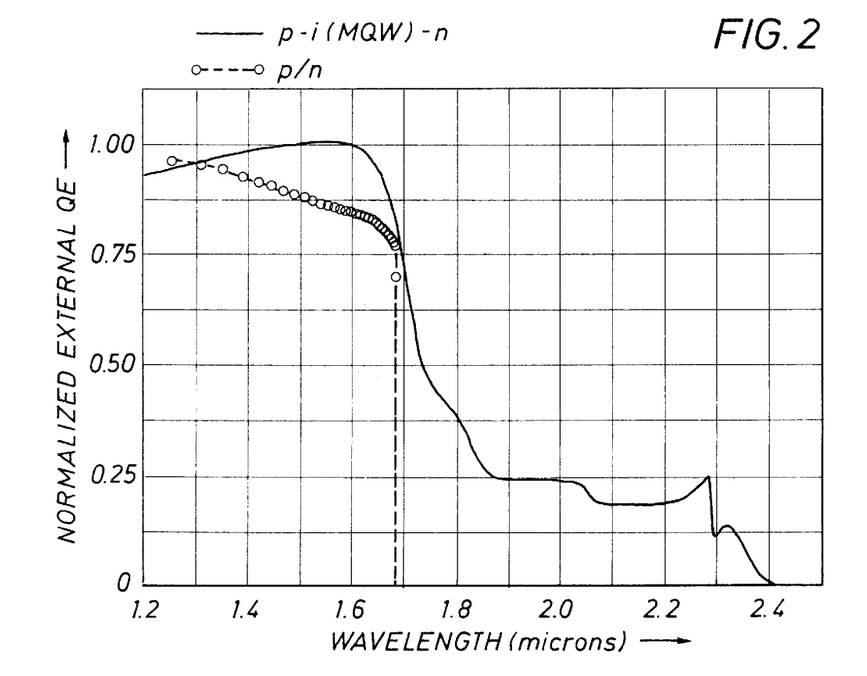
FIG. 2 is a graph of normalized external quantum efficiency vs. wavelength of incident radiation.

The ground confined state energies for different compositions can be calculated using well-known techniques set out in the paper "Modeling p-i (Multi Quantum Well)-n solar cells: a contribution for a near optimum design." (IEEE, *First World Coef. On Photovoltaic Energy Conversion*, 1994). Calculations show that with 90% Indium composition and 60 Å wells, bandgaps can be reduced to a level allowing absorption of wavelengths up to almost 2.4 microns. The MQW region contribution to the photocurrent depends on the diffusion length of the majority carrier photogenerated in a well. This diffusion length is expressed as $L=\mu F\tau$, where F is a perpendicular electric field in the MQW created by the ionized impurities at the junction, $\mu$ is the carrier mobility, and $\tau$ its recombination time. The effective carrier mobility for perpendicular transport in microstructures depends on several processes. Most importantly, the effective mobility depends on thermionic emission, which dominates when the barrier is thick; and multi-hopping when the barrier is thin (phonon-assisted tunneling). The effective mobility of carriers (electrons and holes) versus barrier and well widths, electric field, and temperature can be estimated. Following the modeling of MQW photovoltaic cells, we estimate the diffusion length of carriers in the intrinsic zone $(x_i)$ as $$L_e=10^{-9}cm^2V^{-1}\cdot F \text{ and } L_b=4\cdot10^{-9}cm^2V^{-1}\cdot F \qquad (Eq. 1)$$

where F is the electric field in the intrinsic region in V/cm) for the regions where the quasi-Fermi level is close to the valence or conduction band, respectively. For the typical electric field of 15 kV/cm in the MQW region of a photovoltaic cell, this gives $L_e$=0.15 and $L_b$=0.6 microns. ($L_e$ and $L_b$ refer to emitter and base, respectively. FIG. 2 shows the normalized external quantum efficiency of a MQW TPV cell as a function of incident photon wavelength, for a cell having 20 periods of 90 angstrom wells with 190 angstrom barriers between, with 90 per cent indium in the well, a 0.2 micron emitter and 2.5 micron-thick base. The spectral response of the i(MQW) zone is obtained by solving the continuity equation provided in the paper by Leavitt and Bradshaw (*App. Phys. Lett.* 59, 19 (1991).

Several mechanisms contributing to the dark current of a p-i(MQW)-n photodiode were considered: a diffusion current $I_s$ due to majority carriers diffusing through the junction and recombining in the opposite quasi-neutral region; a generation-recombination (GR) current associated with Shockley-Read-Hall recombination on impurities in the depletion and intrinsic regions; and a tunneling current due to the probability of band-to-band tunneling of carriers through the junction. This current, usually neglected in moderately doped diodes, becomes significant in a MQW under an electric field. This effect becomes more noticeable due to the reduced bandgap of a MQW region and is also influenced by the barrier width.

The device characteristics such as open circuit voltage ($V_{oc}$) and short circuit current ($I_{sc}$) were calculated as a function of In composition, well/barrier thickness and number of wells in the MQW region for a 1000 to 1500 K black body emitter. It is shown that the insertion of narrow bandgap wells extends the spectral response toward the infrared (FIG. 2). A rough estimate shows that for a 1500 K black body up to 40% of the incident power is available for conversion by such a MQW device. Therefore the short circuit current $I_{sc}$ of the p-i($In_xGa_{1-x}As/In_{0.53}Ga_{0.47}As$ MQW)-n cell may be substantially increased compared to that of a baseline p/n $In_{0.53}Ga_{0.47}As$ cell. Device open circuit voltage remains comparable (the voltage drop associated with carrier diffusion, tunneling and reduced mobilities in the well is compensated by the operation at a higher current output).

Figure 3:
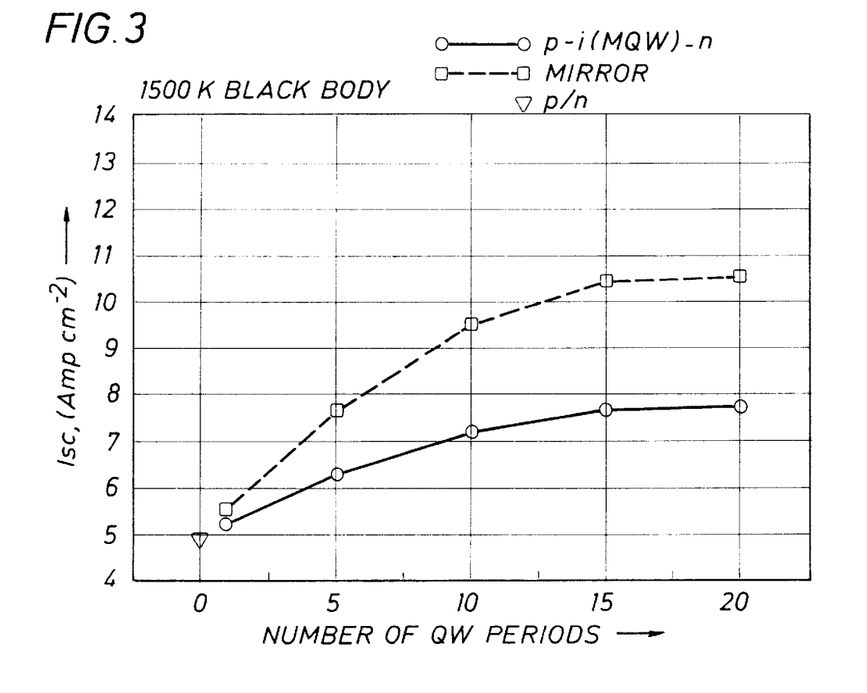
FIG. 3 is a graph of short-circuit electric current vs. the number of quantum well periods.

The introduction of additional QW periods in the intrinsic region increases photocurrent up to a point and a saturation is reached at around 20 periods, as shown in FIG. 3. This can be explained by a decrease in the electric field (in the depletion region) and carrier collection due to the increasing intrinsic region thickness. The $I_{sc}$ of a p/n single cell is shown for reference (zero number of QW periods). This figure shows the short circuit current $I_{sc}$ (A cm$^{-2}$) as a function of number of 60 Å $In_{0.9}Ga_{0.1}As$ wells in the i-region, illuminated with a 1500 K black body. Solid circles show results of a calculation for a p-i(MQW)-n with no back surface reflector. Open squares show results of a calculation for a 100% back surface reflector. Solid square shows results of calculation of $I_{sc}$ of a conventional p/n cell.

Figure 4:
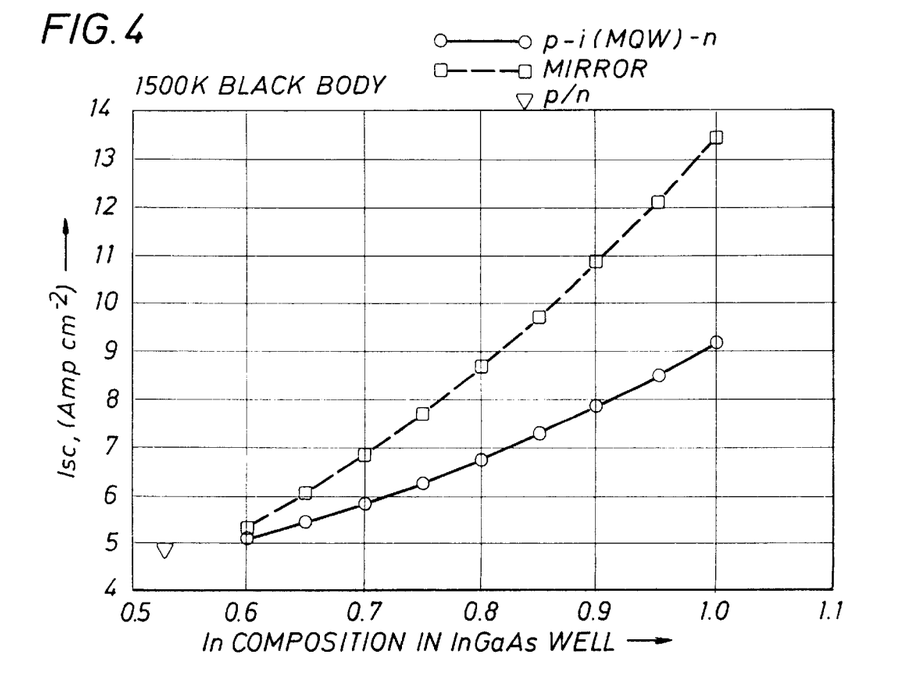
FIG. 4 is a graph of short-circuit electric current vs. the indium concentration in InGaAs quantum wells.

Since a metalization at the back of polished InP substrate acts as an efficient light reflector, we have estimated $I_{sc}$ for both 100% reflective and non-reflective substrates (FIG. 4). For the sake of comparison in our calculations, we fixed the total period thickness (well and barrier) at 0.028 micron. The $I_{sc}$ general behavior with changing number of QW periods should be valid for wells of different thicknesses, provided the period thickness is fixed and that the barrier thickness prevents coupling of the wave functions of individual wells.

Figure 5:
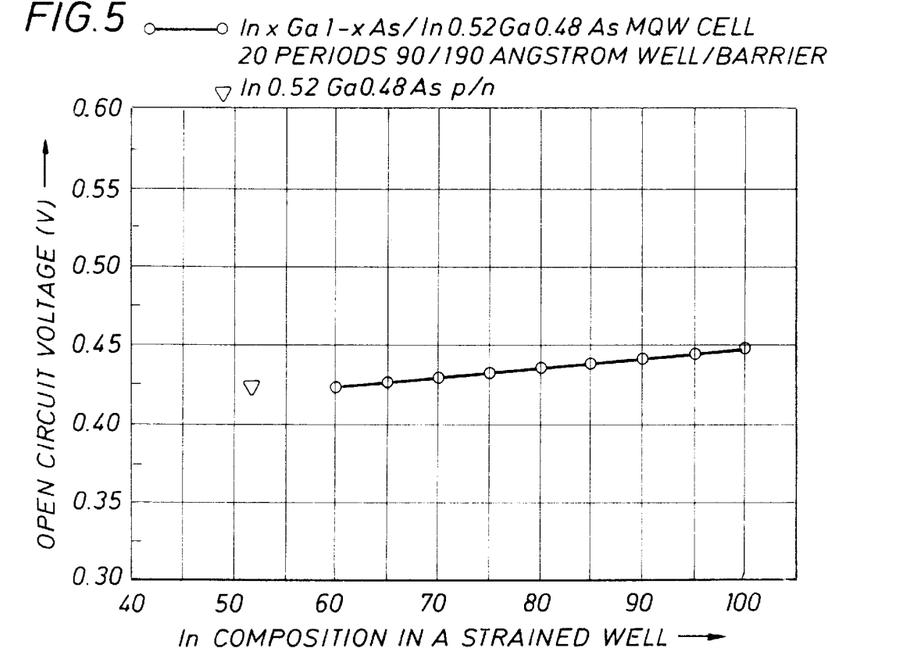
FIG. 5 is a graph of open circuit voltage vs. indium concentration in an InGaAs strained well.

The calculated short circuit current versus InGaAs composition in the well shows substantial enhancement with increasing Indium concentration. FIG. 5 shows the short circuit current $I_{sc}$ as a function of Indium composition in InGaAs well, for a 20-period 90 Å well/190 Å barrier MQW cell for a 1500 K black body emitter.

The open circuit voltage of a MQW cell is expected to be less than that of a baseline cell because of the MQW region dark current increase. However, our calculations showed comparable or slightly higher $V_{oc}$ for the MQW cells when increasing the In composition in the well. In fact, the voltage drop associated with dark current in MQW is compensated by the operation at a higher current due to increased photoabsorption.

As a result, the projected efficiency of this 20-period 90 Å well/190 Å barrier $In_{0.9}Ga_{0.1}As$ well MQW cell (9% for a 1500 K black body) can exceed twice that of a single p/n $In_{0.53}Ga_{0.47}As$ photovoltaic cell (4.5%).

Returning to the calculations of the short circuit current, we can see that 90 Å is a critical thickness for 84% indium composition in InGaAs. Therefore, we project the corresponding cell $I_{sc}$ to be limited to 7.0 A/cm$^2$ at 6.1% efficiency. This can be further increased by doubling the photon path through the MQW region, e.g. using a reflective metalization on the back of the device.

We have presented the results calculated for a 1500 K black body. To give a more complete picture, for a 0.75 eV bandgap p/n cell, about 3% of the power of a 1000 K black body is emitted above its bandgap. This ratio increases to 16% for a 1500 K, and 35% for a 2000 K black body. Assuming no transparency and recombination losses, it leads to a theoretical efficiency limit of 2%, 13% and 26%. For a 0.47 eV bandgap, which is close to the excitonic absorption edge of a strained 90 Å InAs well with $In_{0.53}Ga_{0.47}As$ barriers, these figures are 20%, 48% and 67% of the black body radiant power, respectively. The upper limit of achievable cell efficiency for this MQW approach are projected to be 16%, 34% and 42% for the 1000, 1500 and 2000 K black body respectively.

For typical low temperature TPVs, the conversion efficiency of strained p-i($In_{0.53}Ga_{0.47}As/In_xGa_{1-x}As$ MQW)-n cells is predicted to exceed twice that of their conventional counterparts. This results from improved short circuit current, with no degradation of the open circuit voltage. The expected increase is limited by the number of QW periods that can be grown without relaxation. It is possible to avoid strain limitation on the number of periods by using $In_xGa_{1-x}As$, x<0.53, to balance the well strain. The device concept and model described above can be extended to other TPV semiconductor photovoltaic material systems.

The lattice misfit which occurs during hetero-epitaxy imposes critical limitations on the well thickness and the number of periods which can be grown before the onset of dislocation formation in the epilayer. The critical thickness is estimated by equating the force exerted by misfit strain to tension in the misfit dislocation line. For a single epitaxial film on a substrate of an infinite thickness, the critical thickness $h_c$ for the epilayer grown on (001) InP can be found by solving the following equation:

$$h_C = \frac{b}{4\pi f} \frac{(1-\nu/4)}{(1+\nu)} \left( \ln\frac{h_C}{b} + 1 \right). \quad \text{(Eq. 2)}$$

Figure 6:
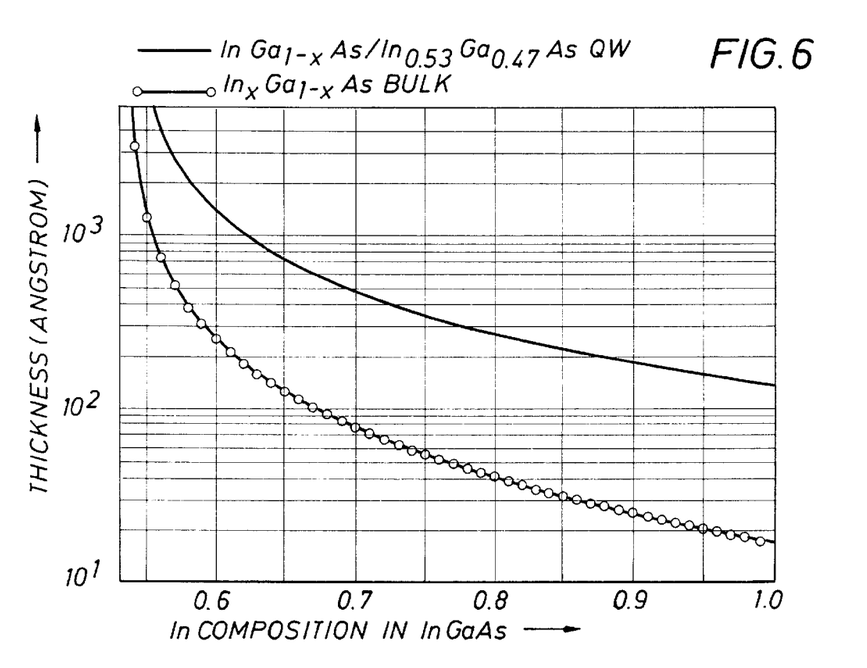
FIG. 6 is a graph of critical thickness vs. Indium composition in InGaAs grown on a (001) InP substrate.

It was assumed in the derivation that the maximum value of the strain $\epsilon$ is equal to the lattice misfit $f=(a_s-a_0)/a_0$ of the overgrowth layer. Here $\nu$ is the Poisson ratio, $a_s$ and $a_0$ are the substrate and overgrowth lattice constants respectively, and $|b|=a_0/\sqrt{2}$ is the magnitude of Burger's vector of dislocation for the (001) growth plane. Critical thickness dependence on indium composition for the epilayer grown on (001) InP is represented in FIG. 6. This figure shows critical thickness (Å) as a function of Indium composition in $In_xGa_{1-x}As$ grown on (001) InP substrate.

For the individual quantum well buried under a barrier layer lattice matched to the substrate, the critical thickness is different from that of a single epitaxial layer. Since the well material strain is partially accommodated by the barrier, the well material critical thickness for the (001) substrate orientation in the MQW is higher than for a single epitaxial layer:

$$L_w^c = \frac{b}{\pi f} \frac{(1-\nu/4)}{(1+\nu)} \left( \ln\frac{L_w^c}{b} + 1 \right). \quad \text{(Eq. 3)}$$

The thicknesses calculated according Equations 2 and 3 are compared in FIG. 6. For a given In composition x in the epitaxial $In_xGa_{1-x}As$ layer, the thickness has to be less than the critical value. A structure containing several strained layers may impose further restrictions.

For a MQW made up of alternating strained wells and unstrained barriers, in addition to the well thickness limitation the overall (average) strain in the heterostructure imposes a limitation on the number of periods. To estimate the maximum number of periods in a MQW, the whole stack of layers is treated as a single epitaxial layer, with the average lattice constant a defined by well ($L_W$) and barrier ($L_B$) layer thicknesses and shear moduli $G_W$ and $G_B$:

$$a = \frac{a_W G_W L_W + a_B G_B L_B}{G_W L_W + G_B L_B} \quad \text{(Eq. 4)}$$

where $a_W$ and $a_B$ are well and barrier lattice constants. (In our case $a_B=a_S$, the substrate lattice parameter)

A force due to the misfit strain in N periods is given by [10, 11]:

$$F_\epsilon = \frac{G(1+v)}{(1-v)} bN(L_W + L_B)\epsilon, \quad \text{(Eq. 5)}$$

where G is the average shear modulus of a MQW structure, and $\epsilon$ is strain.

For the dislocation line starting at the first interface of a stack of N periods the average tension is approximately:

$$F_l = \frac{Gb^2}{4\pi(1-v)}\left((1-v/4)\left(\ln\frac{N(L_W + L_B)}{b} + 1\right)\right) \quad \text{(Eq. 6)}$$

Equating $F_\epsilon$, a force accumulated in the multiple periods due to the misfit strain, to the tension in the misfit line $F_l$, and substituting $\epsilon = f = (a_S - a)/a$, we obtain this equation to solve for the critical number of periods $N_C$:

$$N_C(L_W + L_B) = \frac{b}{4\pi f} \frac{(1-v/4)}{(1+v)} \left(\ln\frac{N_C(L_W + L_B)}{b} + 1\right). \quad \text{(Eq. 7)}$$

Figure 7:
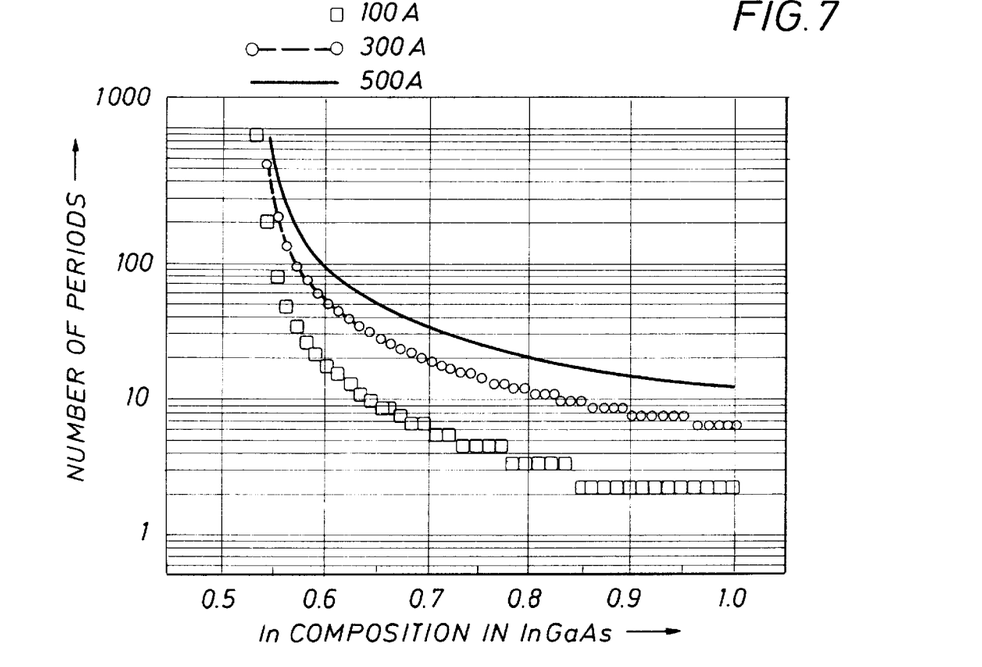
FIG. 7 is a graph of the critical number of periods as a function of indium composition in a 60 angstrom well with differing thickness barriers.

This estimate shows that it would be possible to realize roughly 10-period structures. However, the number of periods can be substantially increased if Q.S. are alternated with tensively strained
In$_x$Ga$_{1-x}$As barriers (x<0.5), whose thickness is $$L_B = \frac{L_W \epsilon_W}{\epsilon_B},$$

where indices W and B stand for well and barrier. FIG. 7 shows the critical number of periods as a function of Indium composition in a well for a 60 Å well with 100, 300 and 500 Å barriers.

The strain-induced modifications of the (001) InGaAs band structure in the MQW were modeled using the parameters of Krijn (*Semicond. Sci. Tech.* 6, 27–31 (1991)). The unstrained ternary compound bandgap was interpolated from the binary components. Following Pikus and Bir's theory of deformation potential and spin-orbit interaction (*Symmetry and Strain-Induced Effects in Semiconductors* (1974), Van der Walle's 'model solid' theory (*Phys. Rev. B* 39 (3) 1871 (1989)) was applied in describing the strain dependence of the valence and conduction band edges of strained InGaAs alloy. The effective masses for electrons and heavy and light holes of the unstrained material were linearly interpolated from GaAs and InAs values. The presence of (001) uniaxial compressive strain in the InGaAs results in an increase of the apparent bandgap of the semiconductor. The tetragonal deformation results in a splitting of heavy hole and light hole ($\Gamma_7$) valence band:

$$E_S = 2\beta\left(\frac{S_{11} - S_{12}}{S_{11} + S_{12}}\right)\epsilon, \quad \text{(Eq. 8)}$$

where $E_S$ is the splitting energy, $\beta$ is the tetragonal deformation potential, $S_{11}$, and $S_{12}$ are the elastic compliances, and $\epsilon = (a_s - a_0)/a_0$ is the magnitude of the in-plane strain. The modifications of the light hole and electron effective masses induced by strain along the quantification axis of the quantum well should also be taken into account in the calculation. This was followed for the electron, but neglected for the light hole, since the well for it is very shallow and its ground state is resonant with the barrier energy.

The calculation of the MQW structure absorption coefficient is based on determining the confinement energies of the electrons and holes in quantum wells and on estimating the absorption rate. The confined energies of the electrons and holes are computed within a one-band model, since it can be shown that in the present case the correction from band non-parabolicity to the confined energies can be neglected. The exciton binding energies are calculated using the method of Leavitt and Little (*Phys. Rev. B* 42, 1177 and 1184 (1990)) and parameters in *Properties of lattice matched and strained Indium Gallium Arsenide*, INSPEC, London (1993). The absorption coefficient is calculated from Fermi's golden rule (Bastard, *Wave Mechanics applied to semiconductor heterostructures*. 1990). The first three confined energy states and excitonic effects for the ground state are accounted for.

Figure 8:
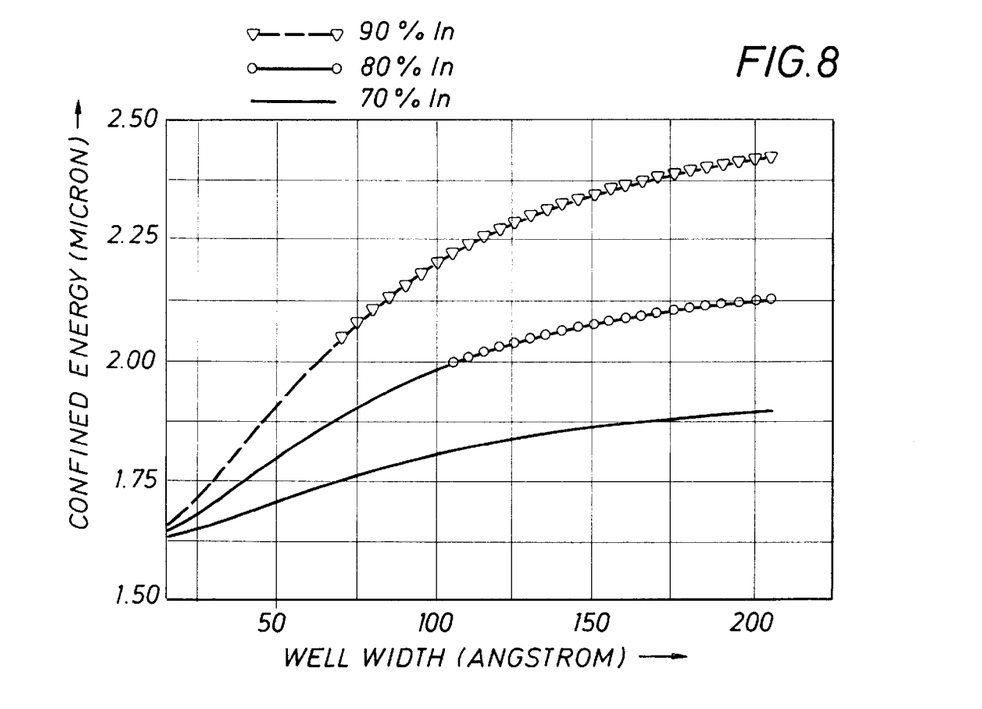
FIG. 8 is a graph of confined energy in microns wavelength vs. quantum well width of $In_xGa_{1-x}As$ for x=0.7, 0.8 and 0.9. The squares indicate energies for wells thicker than critical thickness for defect generation.

For the assessment of the lowest energy absorption edge achievable in a MQW structure, the QW confined energy as a function of the well thickness for different indium compositions. was plotted. The QW critical thickness was estimated using Equations 2 and 7. The ground confined state energies for different compositions are shown on FIG. 8. As can be seen, with 90% Indium composition and 60 Å wells, almost 2 microns confinement can be reached.

The following additional TPV cell design and modeling parameters were used in the calculations above:

TABLE I

| | |
|---|---|
| Thickness, emitter (microns) | 0.2 |
| Thickness, base (microns) | 2.5 |
| Doping, emitter (cm$^{-3}$) | $2 \cdot 10^{18}$ |
| Doping, base (cm$^{-3}$) | $10^{17}$ |
| Period, well + barrier, thickness (microns) | 0.028 |
| Generation-recombination time, (s) | $10^{-6}$ |
| Surface Recombination Velocity (cm$^{-2}$s$^{-1}$) | $10^4$ |
| In$_x$Ga$_{1-x}$As barrier In composition | 0.53 |
| In$_x$Ga$_{1-x}$As well In composition | 0.6–0.9 |
| Temperature (K.) | 300 |

In the approach of this invention, strained narrow bandgap In$_x$Ga$_{1-x}$As/In$_{0.53}$Ga$_{0.47}$As (x>0.6) multiple quantum wells (MQW) are introduced within the intrinsic region of a conventional In$_{0.53}$Ga$_{0.47}$As p-i-n cell lattice matched to InP. The TPV cell parameters are as follows:

TABLE II

| PARAMETER | possible | Preferred | Most preferred |
|---|---|---|---|
| Growth temperature (CBE process) | 300–650 C. | 400–550 | 450–520 |
| Thickness, emitter (microns) | 0.02–1 | 0.05–0.5 | 0.2 |
| Thickness, base (microns) | 0.2–6 | 1–3 | 2.5 |
| Doping, emitter (cm$^{-3}$) | $10^{17} \cdot 10^{19}$ | $1–5x \cdot 10^{18}$ | $2 \cdot 10^{18}$ |
| Doping, base (cm$^{-3}$) | $1–100 \times 10^{16}$ | $1–50 \times 10^{16}$ | $10^{17}$ |
| Period, well + barrier, thickness (microns) | | | 0.028 |
| Well Thickness | 1–20 nm | 1–9 nm | 1–5 nm |
| Barrier Thickness | 5–100 nm | 10–50 nm | 15–30 nm |
| Number of wells | 1–50 | 1–30 | 1–15 |
| In$_x$Ga$_{1-x}$As barrier In composition | 0.35–0.55 | 0.45–0.53 | 0.51–0.53 |
| In$_x$Ga$_{1-x}$As well In composition | 0.6–1 | 0.6–0.9 | 0.7–0.9 |

The well thickness and composition are adjusted to provide maximum current without relaxation of the structure Epitaxial growth runs of TPV cells studied in this example were accomplished by Chemical Beam Epitaxy (CBE) using trimethylindium (TMIn) and pre-cracked arsine (AsH$_3$) and phosphine (PH$_3$) as growth precursors. Si and Be solid sources were used as n-type and p-type dopants respectively. However it is believed that any conventional techniques III-V epitaxial technique that allows growth of p- and n-type materials and quantum wells (such as MOCVD, VPE, MBE or any combination of these techniques) will be adequate to fabricate these devices. Such processes are described in U.S. Pat. No. 5,407,491, which is incorporated herein by reference. One of the advantages of Chemical Beam Epitaxy over MOCVD (MOVPE) is the lower growth temperatures allowing sharper interfaces and reducing dopant cross diffusion This issue is crucial to avoid the degradation of the MQW region during the subsequent growth of the InGaAs emitter/ InGaAs contact layer. Structures were grown in the 480–520° C. temperature range on highly S-doped InP (001) substrates at a typical growth rate of 1 $\mu$m/h (about 1 monolayer/sec.). The undoped 1–10 nm QWs were incorporated in the intrinsic region of p-i-n structures with each well separated by 10–1000 nm thick or thin InGaAs lattice matched to InP barrier to prevent the effect of wave function coupling on carrier transport. The well and barrier thickness and number of periods were chosen so that critical thickness was never exceeded. Interruption growth intervals were monitored and improved in terms of species transient by using mass spectrometry and in situ real time reflection high-energy electron diffraction (RHEED) observations. Between the growth of successive layers, the TMIn and TMG flow were interrupted. To prevent surface decomposition, the $AsH_3$ flow was maintained at a constant rate throughout the growth. Under the optimum growth conditions, a two dimensional 2×1 RHEED pattern was maintained throughout the growth the MQW region. The QW region is preferably grown at a growth rate of 0.3–3 micron per hour and most preferably at a rate of 0.7–1 microns/hour. Following the growth process non-alloyed Au/Ge and Au metallic layers, deposited by vacuum evaporation, were used as n-type (on substrate) and p-type ohmic contacts respectively. The Au-top contact grid was obtained using a lift off technique and an intermediate InGaAs layer (lattice matched to InP) was used to lower the top contact resistivity. the InGaAs contact layer was removed from the cell active area using $H_2SO_4/H_2O_2/H_2O$ solution. The InP window layer between InGaAs emitter and contact layer act as a selective etch stop. A mesa etching of the structure provided a total area per cell of 5×5 $mm^2$. The grid shadowing was estimated to be about 10%. A conventional single or bilayer ARC can be implemented to reduce reflection losses at the device top surface. The device described here is fabricated on conductive surface growth on insulating substrates and processing the device in MIM is also possible using standard MIM recipes developed for lattice matched InGaAs cells The proposed approach can be extended to the use of any type of narrow bandgap conventional p-n cell such as GaSb, GaInAsSb, InAsP, InGaAs, InGaAsP, and InGaAsN. The well material can be substituted by InGaAsN, GaSbN, GaInAsSb, InAsPN InGaAsSb or any combination of these materials that will allow the growth of a MQW region that is pseudomorphically strained to the conventional device base region Modeling data indicate that for a typical 1200 C black body radiation the single junction InGaAs quantum well solar cell will reach a current output generally observed for narrow bandgap cell such as $Ga_xIn_{1-x}As$ (x<25%) with a voltage comparable (or greater) to the one of a conventional 0.75 eV $Ga_{0.47}In_{0.52}As$ cell. In addition, the existing InGaAs TPV cells are already manufactured with techniques that are compatible with Multi-Quantum Well (MQW) growth so quantum wells can be added during growth with little expense. The increase in the efficiency (by nearly a factor of two) will then divide the cost of the kW/hours and the size of modules by a factor of two compared to the present art.

The anticipated advantages of this device over the present art include: higher efficiencies (due to extended spectral photoconversion), lattice matching to InP, no or low dislocations density (reduced dark current and improved survivability), compatibility with standard 0.74 eV InGaAs technology, no limitation on the window material thickness and reduced processing cost compared to heteroepitaxial InGaAs low bandgap cells. Table III shows a comparison of various existing technologies and the anticipated characteristics of the present invention.

TABLE III

| Technology (bandgap) | Silicon (1.1 eV) | GaSb (0.74 eV) | InGaAs (0.75 eV) | InGaAsSb (0.55 eV) | InGaAs (0.55 eV) | This technology InGaAs MQW (0.74–0.49 eV) |
|---|---|---|---|---|---|---|
| Wafer size | | (2 inch) | 3 inch | (2 inch) | 3 inch | 3 inch |
| Energy density for absorbed photons (1500K) | 2% | 15% | 14% | Up to 35% | Up to 35% | 35%–50% |
| Epi cost | NA | NA | Moderate | High, Need for very thick active area | High need for thick graded buffer | Moderate |
| Window/ (recombination losses) | NA | None/ (30–50%) | InP window/ (5–10%) | None/ (50%) | InAsP window (10–20%) | InP window, (5–10%) |
| Operating voltage | | +(>0.3 v) | +(>0.3) | (<0.3 V) | −(<0.3) | +(>0.3) |
| Possibility of fabricating Monolithically integrated modules | | No | Yes | No | Yes | Yes |
| Projected Efficiency at cell level For 1500K black | <<1% | 4–5% | 4–5% | 7–8% | 9–12% | 5–16% |

TABLE III-continued

| Technology (bandgap) | Silicon (1.1 eV) | GaSb (0.74 eV) | InGaAs (0.75 eV) | InGaAsSb (0.55 eV) | InGaAs (0.55 eV) | This technology InGaAs MQW (0.74–0.49 eV) |
|---|---|---|---|---|---|---|
| body radiator Defect density/aging | None | None | none | | Highly possible | None |
| Watt/cm2/cost | None | 1 | Normalized to 1 | | 1.5 | 2 |

The proposed device is expected to enhance the reliability and the efficiency of the thermophotovoltaic converters without the usual shortcomings of the existing heteroepitaxial <0.6 eV InGaAs devices (increased epitaxial process cost, aging, defects etc.). If demonstrated this technology will result in a revolutionary improvement in survivability, performance and manufacturability for nearly all-low temperature thermophotovoltaic commercial applications. Such application includes the 1100 C radioisotope heat sources for deep space missions, and variety of military and civil terrestrial applications ranging from 1200 solar thermophotovoltaics for commercial power grid use to small natural gas TPV portable generators for home use.

The first strained MQW TPV cell structure has been fabricated. As could be deduced from the x-ray characterization data, a 15 period 60/300 Angstrom well/barrier with 0.79 Indium composition in the well successfully maintained pseudomorphism. Similar data were provided for a MQW solar cell in U.S. Pat. No. 5,851,310.

What is claimed is:

1. A semiconductor thermophotovoltaic energy conversion cell of the n-i-p or p-i-n junction type, comprising:

a base, the base being lattice-matched to the substrate and being respectively of the n- or p- type;

an intrinsic region having a plurality of quantum wells therein, wherein each quantum well has a thickness that is below the critical thickness at which defect generation processes are initiated and is formed of strained alloys or of binary materials, the total number of quantum wells being in the range from 2 to about 20;

an emitter region, the emitter region being lattice-matched to the base and being respectively of the p- or n-type; and electrical contacts to the base and emitter region.

2. The energy conversion cell of claim 1 wherein the emitter and the base are made of semiconductor materials lattice-matched to InP.

3. The energy conversion cell of claim 1 wherein the emitter and base are made of InGaAs alloys.

4. A semiconductor thermophotovoltaic energy conversion cell of the n-i-p or p-i-n junction type, comprising:

a base, the base being lattice-matched to the substrate and being respectively of the n- or p-type;

an intrinsic region having a plurality of quantum wells therein, wherein each quantum well has a thickness that is below the critical thickness at which defect generation processes are initiated and is formed of $In_xGa_{1-x}As$, where x is in the range from 0.6 to 0.9, with barriers between wells having a thickness in the range from 10 to 50 nm and a composition of $In_xGa_{1-x}As$, where x is in the range from 0.45 to 0.53;

an emitter region, the emitter region being lattice-matched to the base and being respectively of the p- or n-type; and electrical contacts to the base and emitter region.

5. A semiconductor thermophotovoltaic energy conversion cell of the n-i-p or p-i-n junction type, comprising:

a base, the base being lattice-matched to the substrate and being respectively of the n- or p-type;

an intrinsic region having a multi-quantum well region therein, the multi-quantum region including quantum wells having a thickness below the critical thickness at which defect generation processes are initiated and being formed of a compound selected from the group of compounds consisting of InGaAsN, GaSbN, GaInAsSb, InAsPN and InGaAsSb or mixtures thereof, with barriers between the quantum wells formed of a compound selected from the group of compounds consisting of GaSb, GaInAsSb, InAsP, InGaAsP, and InGaAsN or mixtures thereof, the multi-quantum well region being pseudomorphically strained to the base;

an emitter region; and electrical contacts to the base and emitter region.

* * * * *